United States Patent
Chen et al.

(10) Patent No.: US 10,247,774 B2
(45) Date of Patent: Apr. 2, 2019

(54) TEST KEY STRUCTURE AND METHOD OF MEASURING RESISTANCE OF VIAS

(71) Applicant: UNITED MICROELECTRONICS CORP., Hsin-Chu (TW)

(72) Inventors: Hsin-Hsien Chen, New Taipei (TW); Sheng-Yuan Hsueh, Tainan (TW); Yi-Chung Sheng, Tainan (TW); Wen-Kai Lin, Yilan County (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 227 days.

(21) Appl. No.: 15/369,905

(22) Filed: Dec. 6, 2016

(65) Prior Publication Data
US 2018/0156862 A1    Jun. 7, 2018

(51) Int. Cl.
*G01R 31/28* (2006.01)
*H01L 21/66* (2006.01)

(52) U.S. Cl.
CPC .......... *G01R 31/2884* (2013.01); *H01L 22/34* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 8,179,155 B2 | 5/2012 | Tseng | |
| 2006/0220012 A1* | 10/2006 | Wu | H01L 22/34 257/48 |
| 2013/0075725 A1* | 3/2013 | Huang | H01L 22/34 257/48 |

* cited by examiner

*Primary Examiner* — Tung X Nguyen
(74) *Attorney, Agent, or Firm* — Winston Hsu

(57) ABSTRACT

The present invention provides a test key structure for measuring or simulating a target via array. The structure includes a substrate with a test region, a plurality of first conductive lines in the test region; a plurality of second conductive lines in the test region and on the first conductive lines, wherein the first conductive lines and the second conductive lines overlaps vertically in a plurality of target regions, and a plurality of vias disposed between the first conductive lines and the second conductive lines, wherein at least two vias vertically contact one of the first conductive lines and one of the second conductive lines. The present invention further provides a method of measuring resistance by using the testkey structure.

19 Claims, 4 Drawing Sheets

TEST KEY STRUCTURE AND METHOD OF MEASURING RESISTANCE OF VIAS

BACKGROUND OF THE INVENTION

1. Field of the Invention

The present invention relates to testkey structure and a method of measuring resistance of vias, and more particularly, to a testkey structure with novel via array and a method of measuring resistance by using the testkey structure

2. Description of the Prior Art

In the standard semiconductor process, in order to evaluate the efficiency of each procedure and to confirm the performance of the elements after the procedures, a wafer acceptance test (WAT) is performed on the wafers. The wafer acceptance test includes electrical tests on the pads disposed around the peripheral regions of the dices. The main purposes of the wafer acceptance test are to confirm the stability of the semiconductor process as well as to enhance the yield of dices. By means of the wafer acceptance test, the quality and the stability of the wafers are somewhat ensured.

In order to carry out the test successfully, the test keys disposed around the peripheral regions of dices play an important role. For this purpose, test keys which are electrically connected to the electronic elements are formed. The test keys are usually formed on the scribe lines between the dices and electrically connected to the electronic elements through pads. The layout of the test keys are generally related to the numbers of the electrodes of the electronic elements. Depending on the numbers of the electrodes, an electronic element may be electrically connected to two to four pads.

SUMMARY OF THE INVENTION

The present invention therefore provides a method of a novel testkey structure for precisely measuring the resistance of the target via array.

According to one embodiment, a test key structure is provided. The structure includes a substrate with a test region, a plurality of first conductive lines in the test region; a plurality of second conductive lines in the test region and on the first conductive lines, wherein the first conductive lines and the second conductive lines overlaps vertically in a plurality of target regions, and a plurality of vias disposed between the first conductive lines and the second conductive lines, wherein at least two vias vertically contact one of the first conductive lines and one of the second conductive lines.

According to another embodiment of the present invention. A method for measuring resistance of vias. First, a testkey structure shown above is provided. Then, a number (n) of the vias in the target region is obtained. A voltage value (V) from one terminal of the first conductive line and one terminal of the second conductive line is provided. Then, a current value (I) is measured from another terminal of the first conductive line and another terminal of the second conductive line. Lastly, a resistance value (Rc) of one via is obtained by equation (Rc=n*V/I).

In light of above, the testkey structure in the present invention with novel via array can simulate various via arrangement of the target via array in the die region, thus can measure the resistance the target via array precisely.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
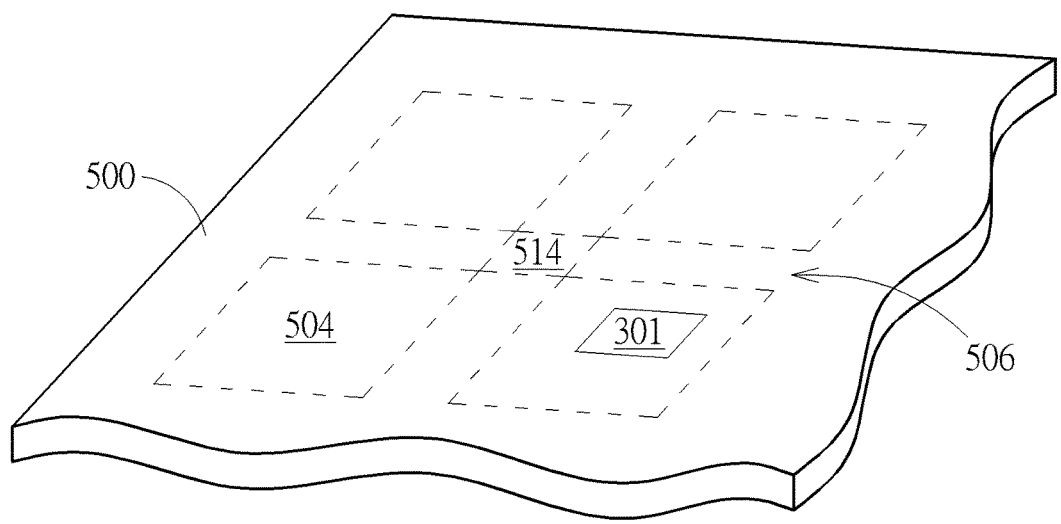
FIG. 1 shows a schematic diagram of a wafer having the semiconductor structures according to one embodiment of the present invention.

Please refer to FIG. 1, which shows a schematic diagram of a wafer having the semiconductor structures according to one embodiment of the present invention. As shown in FIG. 1, a wafer 500 is provided. The wafer 500 includes a plurality of die regions 504 and a dicing region 506. In one embodiment, the die regions 504 are arranged in an array manner and each die region 504 is encompassed by the dicing region 506. In the subsequent process, various semiconductor structures (not shown) such as Fin-FETs will be formed in the die regions 504 for executing logic or non-logic process, and thereafter, a dicing process will be carried out along a central line of the dicing region 506 for example, to separate each dicing region 504 into a single die.

In monitoring or simulating the integrated circuits in the die region 504, a testkey structure (not shown in FIG. 1 but shown in FIG. 2) is disposed in the test region 514 which is in the dicing region 506 located in the intersection cross between four die regions 504. However, it is understood that the test region 514 can be disposed in other regions in the dicing region 506, or in another embodiment, the test region 514 can be formed in the die region 504, depending on the design of the products.

Figure 2:
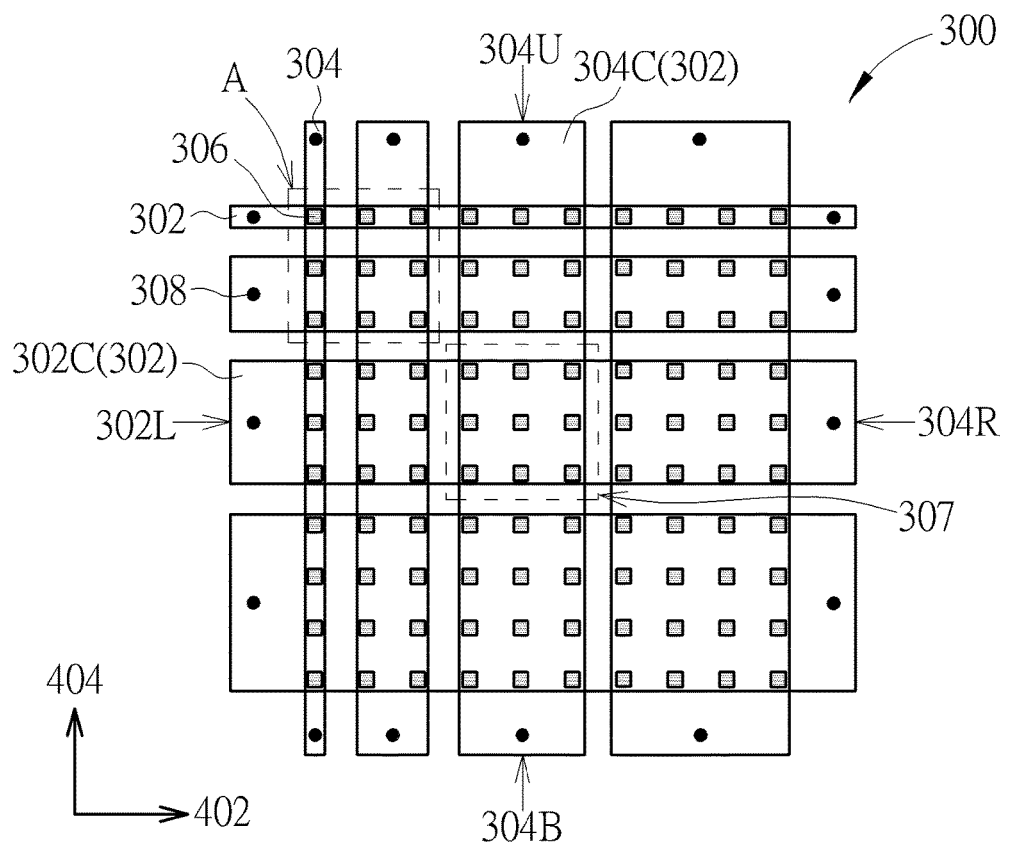
FIG. 2 shows a schematic diagram of the testkey structure according to one embodiment of the present invention.
Figure 3:
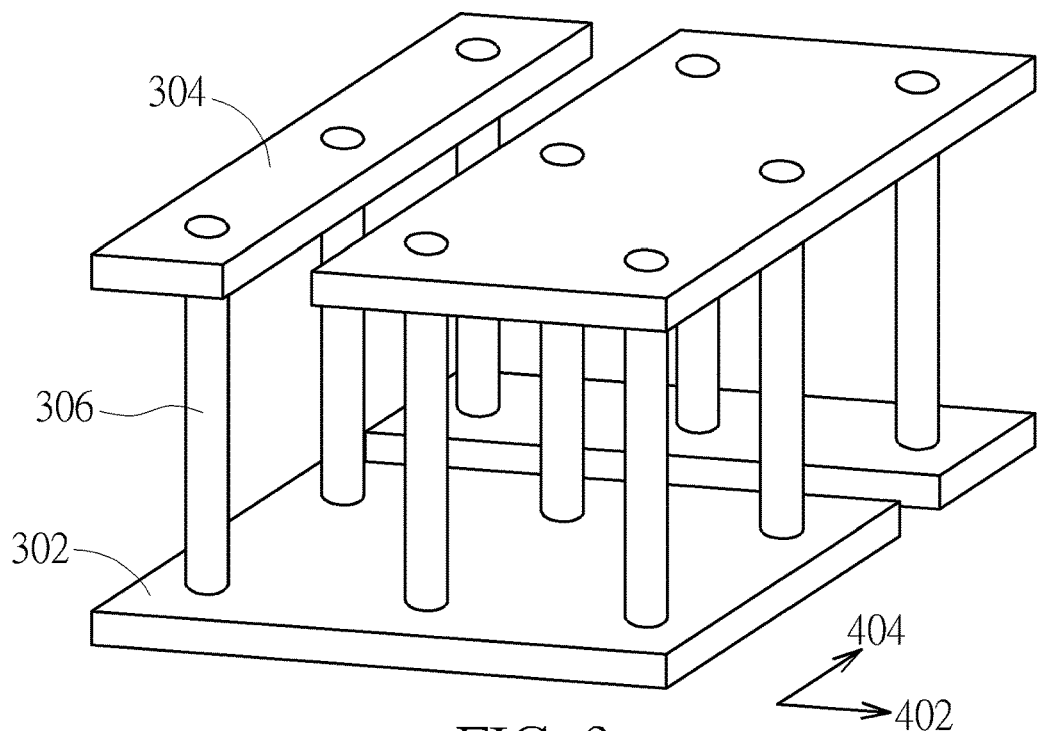
FIG. 3 shows a three dimensional diagram of the testkey structure according to one embodiment of the present invention.

In the test region 514, the testkey structure 300 can be used to monitor or simulate a via array in the logic or non-logic region in the die region 504 (the "target via array 301" hereinafter). Please refer to FIG. 2 and FIG. 3, which shows a schematic diagram of the testkey structure according to one embodiment of the present invention, wherein FIG. 2 is a top view and FIG. 3 is a three dimensional view from region A of FIG. 2. Please see FIG. 2 first, the testkey structure 300 contains a plurality of first conductive lines 302, a plurality of second conductive lines 304, and a plurality of vias 306. The first conductive lines 302 are parallel to each other and stretch along a first direction 402. Each first conductive line 302 can have different widths and in this embodiment, the widths of the first conductive lines 302 increase gradually from upside to downside. The second conductive lines 304 are parallel to each other and stretch along a second direction 404, wherein the second direction 404 is substantially perpendicularly to the first direction 402. Each second conductive line 304 can have different widths and in this embodiment, the widths of the second conductive lines 304 increase gradually from left to right. As from the top view of FIG. 2 or the three dimensional view of FIG. 3, the first conductive lines 302 and the second conductive lines 304 vertically overlaps with each other to form a plurality of target regions 307. The vias 306 are disposed between the first conductive lines 302 and the second conductive lines 304 to directly contact one of the first conductive lines 302 and one of the second conductive lines 304 in the vertical direction. In one preferred embodiment, the vias 306 are arranged in an array, meaning that the vias 306 can be arranged in order with a plurality of rows and/or a plurality of lines. In one preferred embodiment, the rows of the vias 306 and the lines of the vias 306 are substantially parallel to the first direction 402 and the second direction 404. Preferably, each via 306 is identical to each other so they have the same shape (rectangle or circle for example) and the same width and height. At the terminals of each first conductive line 302 and each second conductive line 304, there are plugs 308 directly contact the first conductive line 302 and the second conductive line 304 so as to provide the test signal pass therethrough.

By using the testkey structure 300 with the array vias 306 and the plural first conductive lines 302 and second conductive lines 304, the resistance of the vias 306 can be easily measured by using Kelvin (4-wire) resistance measuring method. Taking area A for example, there are nine vias connecting the first conductive line 302C and the second conductive line 304C in parallel. The resistance of each via 306 can be determined by the following equation:

$$Rc=9*V/I,$$

Rc is the resistance of one via; V is the voltage value between the left terminal 302L of the first conductive line 302C and the upside terminal 304U of the second conductive line 304C; I is the current value between the right terminal 304R of the first conductive line 302C and the bottom terminal 304B of the second conductive line 304C. By supplying appropriate voltage and then measure the current, the resistance of each via can therefore be obtained.

Since it is easy to measure the via resistance value, when there is a via array in the die region 504 ("target via array 301") and it is desired to check the resistance of the target array, the testkey structure 300 in the present invention can simulate the target via array 301 in the die region 504. Taking FIG. 2 for example, if the target via array 301 exhibits 3×3 square array, the resistance of each via can be simulated and measured by measuring the resistance in region A. The result of the resistance of the vias can be helpful for adjusting the input/output voltage when operating the integrated circuit.

Figure 4:
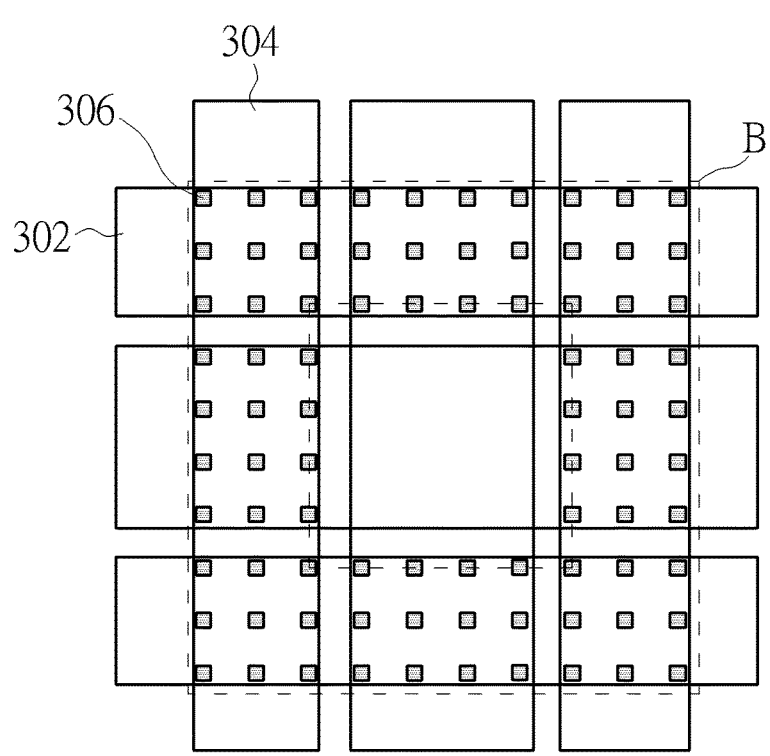
FIG. 4 shows a schematic diagram of the testkey structure according to another embodiment of the present invention.

By adjusting the arrangement of the array vias 306 and/or the first conductive lines 302 and/or the second conductive lines 304, various via arrangement can be simulated to precisely match the target via array 512 in the die region 504. Please refer to FIG. 4, which shows the testkey structure according to one embodiment of the present invention. As shown in FIG. 4, the simulated via array exhibits a hollow shape (region B), preferably an outer contour rectangle and inner contour rectangle. By appropriate setting the first conductive lines 302 and the second conductive lines 304, the disturbance of the central vias can be eliminated and the via resistance can be obtained more precisely.

Figure 5:
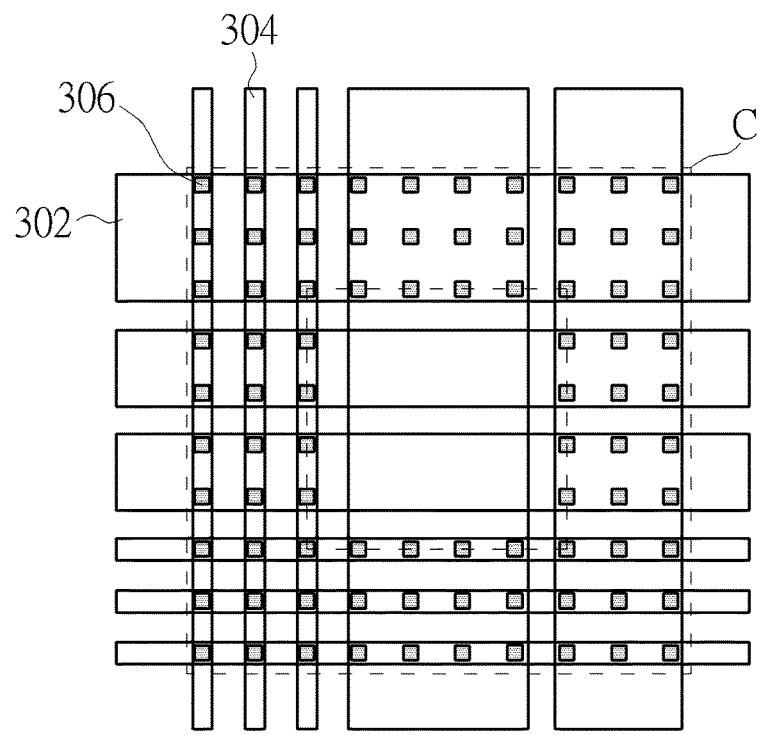
FIG. 5 shows a schematic diagram of the testkey structure according to another embodiment of the present invention.

Please refer to FIG. 5, which shows the testkey structure according to another embodiment of the present invention. In this embodiment, a hollow via array form the top view is also provided. From consideration of the metal lines connecting the target via array, the first conductive lines 302 and the second conductive lines 304 can be adjusted arbitrarily. For example, as shown in FIG. 5, there are six first conductive lines 302 and one of which connects three vias 306, two of which connects two vias 306 and three of which connects one via 306; there are five second conductive lines 304 and one of which connects four vias 306, one of which connects three vias 306 and three of which connects one via 306. It is understood that in order to simulating the target via array 301 in the die region 504 more precisely, other arrangement can be provided, depending on the designs. Besides the "hollow" via array shown in FIG. 4 and FIG. 5, other common via array, such as "L shaped" via array can also be available in the testkey structure 300.

Figure 6:
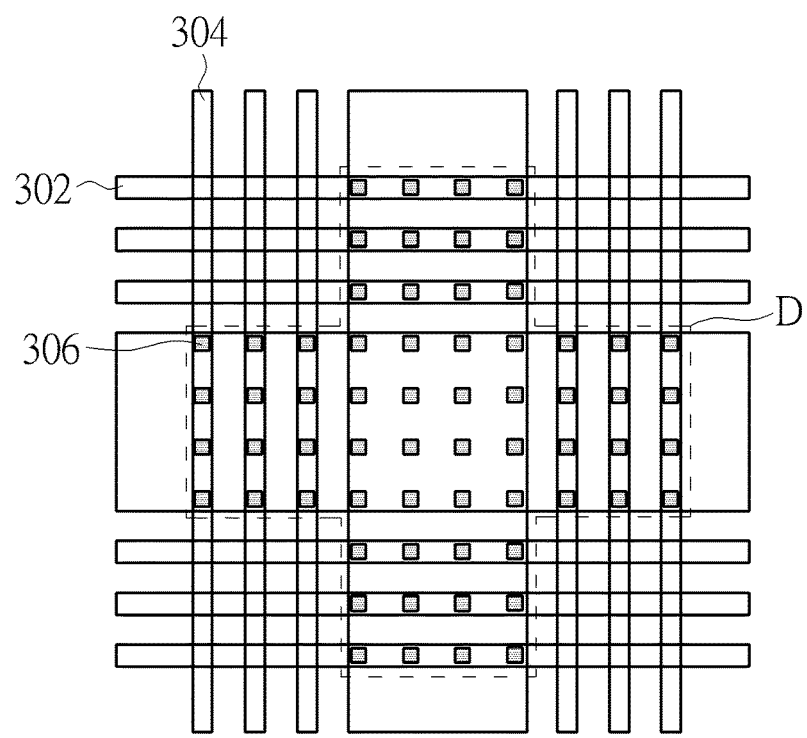
FIG. 6 shows a schematic diagram of the testkey structure according to another embodiment of the present invention.

Please refer to FIG. 6, which shows the testkey structure according to another embodiment of the present invention. In this embodiment, the array of the vias 306 exhibits a cross shape (region D)b with width and long contain four vias 306. Similarly, the first conductive lines 302 and the second conductive lines 304 can be arranged to match the cross shape of the vias 306. It is also understood that FIG. 6 only shows one embodiment for the arrangement of the first conductive lines 302 and the second conductive lines 304, and it is available in other embodiments, as long as all the vias 306 are connected by the first conductive lines 302 and the second concoctive lines 304.

Figure 7:
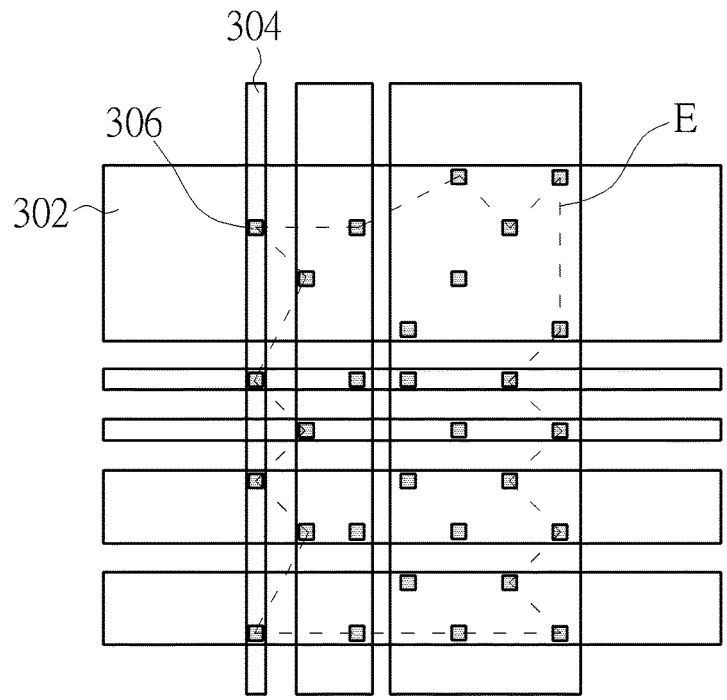
FIG. 7 shows a schematic diagram of the testkey structure according to another embodiment of the present invention.

Please refer to FIG. 7, which shows the testkey structure according to another embodiment of the present invention. As shown in FIG. 7, the array of the vias 306 is not arranged along the first direction 402 and the second direction 404. That is, the line in the array of the vias 306 and/or the row in the array of the vias 306 are not parallel to the first direction 402 and/or the second direction 404. This embodiment can more fit the complicated target via array in the die region 504. Similarly, the arrangement of the first conductive lines 302 and the second conductive lines 304 can be adjusted according to the via array.

Figure 8:
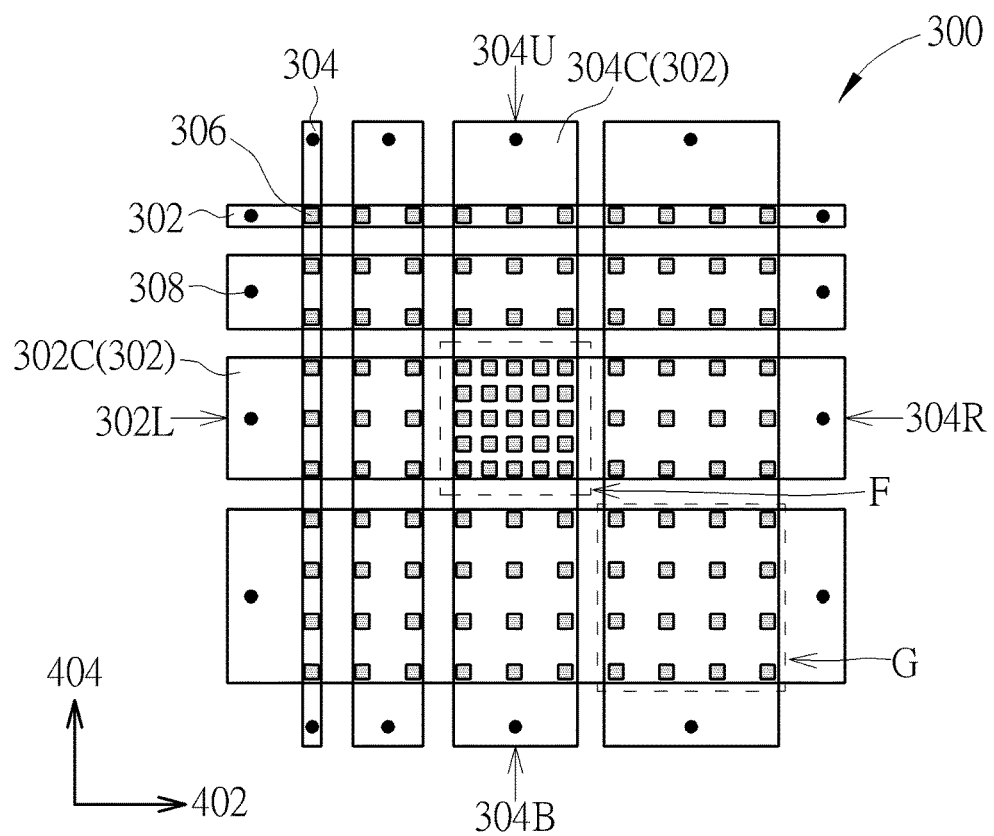
FIG. 8 shows a schematic diagram of the testkey structure according to another embodiment of the present invention.

Depending on the target via array, the density of the via array can be different. Please refer to FIG. 8, which shows the testkey structure according to another embodiment of the present invention. Comparing to the embodiment in FIG. 2 that shows equal via density, in this embodiment, the via density in region F is greater than the via density in region G. It is noted that in this embodiment, since the vias 306 are identical to each other, the via density refers to "numbers of the via/area." In another embodiment when the vias 306 are not identical to each other, the via density may refer to "total via area/area."

Besides simulating the real resistance value of the target via array 301, the testkey structure 300 can help monitor the via manufacturing process of the target via array 301. It is understood that it contains a plurality of process for forming a via, for example, photo-etching-process (PEP), metal filling process, chemical mechanical process (CMP), and the like. Once there is an error during these processes, the via would not be formed precisely, resulting in variations of the resistance of each via. In solving the problem, the testkey structure 300 can help monitor if there is process error when forming the target via array 301. For instance, after simultaneously forming the target via array 301 in the die region 504 and the testkey structure 300 in the test region 514, the resistance value of the testkey structure 300 can be measured. Since the resistance value of the testkey structure 300 can reveal resistance value of the target via array, the obtained resistance value can be checked if it can match the predetermined value of resistance of the via in the target via array 301 ordinarily designed. It not, it is known that there must be a process error in the via forming process.

In light of above, the testkey structure in the present invention with novel via array can simulate various via arrangement of the target via array in the die region, thus can measure the resistance the target via array precisely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key structure, comprising:
a substrate with a test region;
a plurality of first conductive lines in the test region;
a plurality of second conductive lines in the test region and on the first conductive lines, wherein the first conductive lines and the second conductive lines overlaps vertically in plurality of target regions; and
a plurality of vias disposed between the first conductive lines and the second conductive lines, wherein at least two vias vertically contact one of the first conductive lines and one of the second conductive lines, wherein a density of the vias in one of the target regions is different from a density of the vias in another one of the target regions.

2. The test key structure according to claim 1, wherein the vias are identical to each other.

3. The test key structure according to claim 1, wherein the vias have an L-shaped contour from a top view.

4. The test key structure according to claim 1, wherein the vias have a hollow contour from a top view.

5. The test key structure according to claim 1, wherein the first conductive lines stretch along a first direction, the second conductive lines stretch along a second direction, and the first direction and the second direction are perpendicular to each other.

6. The test key structure according to claim 5, wherein the vias are arranged in array and rows and/or lines of the array of the vias are not perpendicular to the first direction.

7. The test key structure according to claim 1, further comprising a plurality of plugs electrically connecting terminals of the first conductive lines and the terminals of the second conductive lines.

8. The test key structure according to claim 1, wherein the test region is disposed in a scribe line on the substrate.

9. The test key structure according to claim 1, further comprising a target via array in a die region on the substrate, wherein the test key structure corresponds to the target via array.

10. A method for measuring resistance of vias, comprising:
providing a test key structure, comprising:
a substrate with a test region;
a plurality of first conductive lines in the test region;
a plurality of second conductive lines in the test region and on the first conductive lines, wherein the first conductive lines and the second conductive lines overlaps vertically in a plurality of target regions; and
a plurality of vias disposed between the first conductive lines and the second conductive lines, wherein at least two vias vertically contact one of the first conductive lines and one of the second conductive lines;
choosing one target region and obtaining a number (n) of the vias in the chosen target region;
providing a voltage value (V) from one terminal of the first conductive line and one terminal of the second conductive line corresponding the chosen target region;
measuring a current value (I) from another terminal of the first conductive line and another terminal of the second conductive line corresponding the chosen target region; and
obtaining a resistance value (Rc) of one via in the chosen target region by equation:

$$Rc=n*V/I.$$

11. The method for measuring resistance of vias according to claim 10, wherein the vias are identical to each other.

12. The method for measuring resistance of vias according to claim 10, wherein the vias have an L-shaped contour from a top view.

13. The method for measuring resistance of vias according to claim 10, wherein the vias have a hollow contour from a top view.

14. The method for measuring resistance of vias according to claim 10, wherein a density of the vias in one of the target regions is different from a density of the vias in another one of the target regions.

15. The method for measuring resistance of vias according to claim 10, wherein the first conductive lines stretch along a first direction, the second conductive lines stretch along a second direction, and the first direction and the second direction are perpendicular to each other.

16. The method for measuring resistance of vias according to claim 15, wherein the vias are arranged in array and rows and/or lines of the array of the vias are not perpendicular to the first direction.

17. The method for measuring resistance of vias according to claim 10, further comprising providing a target via array in a die region on the substrate, wherein the test key structure corresponds to the target via array.

18. The method for measuring resistance of vias according to claim 17, further comprising comparing the resistance value (Rc) to a predetermined resistance value of the target via array.

19. The method for measuring resistance of vias according to claim 18, further comprising determining if there is a process error according to the comparing result between the resistance value (Rc) and the predetermined resistance value of the target via array.

* * * * *